United States Patent [19]
Zou et al.

[11] Patent Number: 5,374,890
[45] Date of Patent: Dec. 20, 1994

[54] SIMULTANEOUS MAGNETIC RESONANCE IMAGING OF MULTIPLE HUMAN ORGANS

[75] Inventors: Xueming Zou, Chesterland; John L. Patrick; James M. McNally, both of Chagrin Falls, all of Ohio

[73] Assignee: Picker International, Inc., Highland Hts., Ohio

[21] Appl. No.: 32,128

[22] Filed: Mar. 17, 1993

Related U.S. Application Data

[63] Continuation-in-part of Ser. No. 19,234, Feb. 18, 1993, and a continuation-in-part of Ser. No. 919,215, Jul. 24, 1992, Pat. No. 5,280,248, and a continuation-in-part of Ser. No. 922,162, Jul. 29, 1992.

[51] Int. Cl.$^5$ .............................................. G01V 3/00
[52] U.S. Cl. ..................................... 324/318; 324/309
[58] Field of Search ............... 324/307, 309, 314, 318, 324/322; 128/653.3

[56] References Cited

U.S. PATENT DOCUMENTS

| | | | |
|---|---|---|---|
| 4,668,915 | 5/1987 | Daubin et al. | 324/309 |
| 4,777,438 | 10/1988 | Holland | 324/309 |
| 4,825,162 | 4/1989 | Roemer et al. | 324/318 |
| 4,871,968 | 10/1989 | Kanayama | 324/318 |
| 4,924,868 | 5/1990 | Krause et al. | 128/653 |
| 4,943,775 | 7/1990 | Boskamp et al. | 324/318 |
| 4,973,907 | 11/1990 | Bergman et al. | 324/318 |
| 5,041,790 | 8/1991 | Tropp et al. | 324/318 |
| 5,138,260 | 8/1992 | Molyneaux et al. | 324/309 |
| 5,160,891 | 11/1992 | Keren | 324/318 |
| 5,258,717 | 11/1993 | Misic et al. | 324/318 |

FOREIGN PATENT DOCUMENTS

| | | |
|---|---|---|
| 0335534A3 | 10/1989 | European Pat. Off. |
| 0374994A1 | 6/1990 | European Pat. Off. |
| 0407579A1 | 1/1991 | European Pat. Off. |
| 0498539A1 | 8/1992 | European Pat. Off. |
| 3828718A1 | 3/1989 | Germany |
| 4037294A1 | 7/1991 | Germany |
| WO93/03393 | 2/1993 | WIPO |

OTHER PUBLICATIONS

"Parallel Acquisition of MR Images Using Time Multiplexed Coils", Wright, et al., 8030 Electronics Letters, 28 (1992) 1 Jan. No. 1.

"The NMR Phased Array", Roemer, et al., Mag. Res. Imaging in Medicine, vol. 16, 192–225 (1990).

"Parallel Image Acquisition From Noninteracting Local Coils", Hyde, et al. Journal of Magnetic Resonance 70, 512–517 (1986).

"Coil Holder and Marker System for MR Imaging of the Total Spine", Abrahams, et al., Radiology 1989; 172: 869–871.

"Switched Array Coils", Requardt, et al., Magnetic Resonance in Medicine 13, 835–397 (1990).

"Quadrature Switchable Spine Array Coils", Molyneaux, et al. SMRM 1989, p. 952.

"Faraday Shielded Switchable Surface Coil Arrays", Molyneaux, et al. SMRM 1989, p. 60.

*Primary Examiner*—Louis Arana
*Attorney, Agent, or Firm*—Fay, Sharpe, Beall, Fagan, Minnich & McKee

[57] ABSTRACT

Superconducting magnets (10) of a magnetic resonance imager create static magnetic fields through an examination region (12). Gradient magnetic field coils (30) under control of a gradient magnetic field control (42) generate gradient magnetic fields across the examination region (12), as a whole. A plurality of surface coils (36, 38) receive radio frequency signals from each of two distinct subregions within the examination region (12). The two receiver coils are connected with separate receivers ($60_1$, $60_2$) which demodulate the received magnetic resonance signals. The magnetic resonance signals are reconstructed (76) into an image representation (80, 82) of the first and second subregions. In the embodiment of FIGS. 1 and 2, a radio frequency transmitter (40) and a whole body coil (32) generate and manipulate the magnetic resonance signals within the first and second subregions. In the embodiment of FIGS. 3 and 4, a plurality of transmitters ($40_1$, $40_2$, . . . ) convey RF signals to the surface coils such that the surface coils operate in both a transmit and receive mode. Regardless whether a single transmitter or a series of transmitters is utilized, a sequence control (44) controls the transmitter(s) and the gradient control (42) to conduct conventional magnetic resonance imaging sequences in coordination in both subregions.

21 Claims, 4 Drawing Sheets

SIMULTANEOUS MAGNETIC RESONANCE IMAGING OF MULTIPLE HUMAN ORGANS

The present application is a continuation-in-part of U.S. application Ser. No. 08/019,234, filed Feb. 18, 1993, U.S. application Ser. No. 07/919,215 filed Jul. 24, 1992, now U.S. Pat. No. 5,280,248 U.S. application Ser. No. 07/922,162 filed Jul. 29, 1992.

BACKGROUND OF THE INVENTION

The present invention relates to the magnetic resonance diagnostic arts. It finds particular application in conjunction with the simultaneous imaging of a plurality of human organs and will be described with particular reference thereto. It is to be appreciated, however, that the invention will also find application in conjunction with the concurrent imaging of non-human subjects and in conjunction with certain spectroscopic examinations of human and non-human subjects.

Conventional magnetic resonance imaging systems can perform whole body imaging in which a large region of the torso is examined. Diagnostic images which typically span the large region may intersect adjacent organs. However, the scale or detail associated with individual organs within a small part of the large image are relatively limited. Another disadvantages with whole body RF coils is that the signal-to-noise ratio tends to be low.

To obtain improved, more detailed images of organs, conventional magnetic resonance imaging systems include dedicated transmission and reception coil assemblies for performing diagnostic examinations of a single organ at a time. In many instances, a separate transmitter coil and a receiver coil are used to generate images of the selected organ. Often, the RF coil assemblies are dedicated to a specific part of the human body, such as a head coil or a neck coil. Generally, a dedicated RF coil is only used to produce images from the corresponding organ. The magnetic resonance signal received by the dedicated RF coil itself is sufficient to generate a magnetic resonance image of the corresponding organ.

The dedicated RF coil assemblies can be either a single coil or a combination of RF coils which operate together to generate an image of the region of interest. One type of multiple coil assembly for imaging a dedicated region is a phased-array coil. See for example, U.S. Pat. No. 4,825,162 of Roemer, et al. or U.S. Pat. No. 4,973,907 of Bergman, et al.

Using individual surface coils to image multiple organs has drawbacks. First, the patient must be removed from the bore of the magnetic resonance imager to swap dedicated coils. This reduces patient throughput. Second, the images of the two organs are taken at time displaced intervals. In some diagnostic techniques, it would be advantageous to image two or more organs in a known temporal relationship. For example, it is often advantageous to coordinate images of the heart and images of the patient's circulatory system or other organs whose configuration or functioning changes with the cardiac cycle. Analogously, other pairs of organs can be imaged in a known relationship.

With phased-array RF coils, images of a single organ or a localized volume in the patient are generated with the several linear surface coils of the phased-array. Each coil contributes a part of the whole image. Multiple receiver channels are required with the phased array. Moreover, image data from each phased-array coil is combined with images or signals from other coils of the array and undergo a complicated image processing procedure. To the extent that a phased-array coil might extend adjacent to organs, the coil system is optimized for only a single one of the organs.

In accordance with the present invention, a new and improved imaging method is provided in which two or more organs are imaged concurrently.

SUMMARY OF THE INVENTION

In accordance with the present invention, a magnetic resonance imaging system is provided. A main magnet means generates a static magnetic field through a portion of a subject in an examination region. A gradient field means selectively generates magnetic field gradients across the examination region as a whole. A magnetic resonance excitation means excites magnetic resonance in at least first and second subregions of the subject portion that is in the examination region. A magnetic resonance imaging sequence control means causes the resonance excitation means and the gradient field means to apply RF and gradient field pulses of magnetic resonance imaging sequences to the examination region. A first receiver coil disposed adjacent the first subregion receives magnetic resonance signals from the subregion. A second radio frequency coil disposed adjacent the second subregion receives magnetic resonance signals from the second subregion. A first radio frequency receiver is connected to the first receiver coil for receiving and demodulating magnetic resonance signals from the first receiver coil. A second radio frequency receiver means receives and demodulates magnetic resonance signals received by the second receiver coil. A reconstruction means reconstructs magnetic resonance signals received and demodulated by the first radio frequency receiver means into first electronic image representations and reconstructs magnetic resonance signals received and demodulated by the second radio frequency receiver means into second electronic image representations. A video processing means selectively converts the first and second electronic image representations into a human-readable display.

In accordance with a more limited aspect of the present invention, the resonance excitation means includes a whole body RF coil and a radio frequency transmitter.

In accordance with another more limited aspect of the present invention, the first receiver coil is a quadrature coil. A quadrature combiner connects the quadrature first receiver coil with the first radio frequency receiver means. The quadrature combiner imposes a 90° phase shift on one of two components received from the first receiver coil.

In accordance with another more limited aspect of the present invention, at least the first receiver coil includes a quadrature coil that has first and second output ports. The first receiver means includes a first digital receiver connected with the first port and a second digital receiver connected with the second port.

In accordance with another more limited aspect of the present invention, the resonance excitation means includes a first radio frequency transmitter means connected with the first receiver coil and a second radio frequency transmitter means connected with the second receiver coil. In this manner, the first and second receiver coils operate in both transmit and receive modes.

In accordance with another aspect of the present invention, a magnetic resonance imaging system is provided. A static magnetic field means creates a static magnetic field through an examination region in which at least a portion of a subject is disposed. A gradient field means selectively applies magnetic field gradients across the examination region as a whole. A resonance excitation means excites and manipulates magnetic resonance in at least first and second subregions of the subject. First and second RF coils are disposed adjacent the first and second subregions for concurrently receiving magnetic resonance signals from the first and second subregions, respectively. A processing means processes the magnetic resonance signals received by the first and second RF coils into first and second image representations, respectively.

In accordance with another aspect of the present invention, a method of magnetic resonance imaging is provided. A static magnetic field is created through an examination region in which at least a portion of the subject is disposed. Magnetic field gradients are applied across the examination region as a whole. Magnetic resonance is excited and manipulated in at least the first and second subregions of the subject. Magnetic resonance signals from the first and second subregions are received concurrently by first and second RF coils disposed adjacent the first and second subregions, respectively. The magnetic resonance signals received by the first and second RF coils are processed into first and second image representations, respectively.

A first advantage of the present invention is that it permits the imaging of two separate portions of the human body with a known correlation in time, preferably simultaneous imaging.

Another advantage of the present invention is that it improves scanner throughput. Concurrently imaging two areas of the body enables more examinations to be conducted per unit time.

Another advantage of the present invention is that images over relatively large regions of the body can be obtained, with each image having a high signal-to-noise ratio and high resolution. The present invention facilitates spectroscopy, magnetization transfer, and other more sophisticated techniques.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
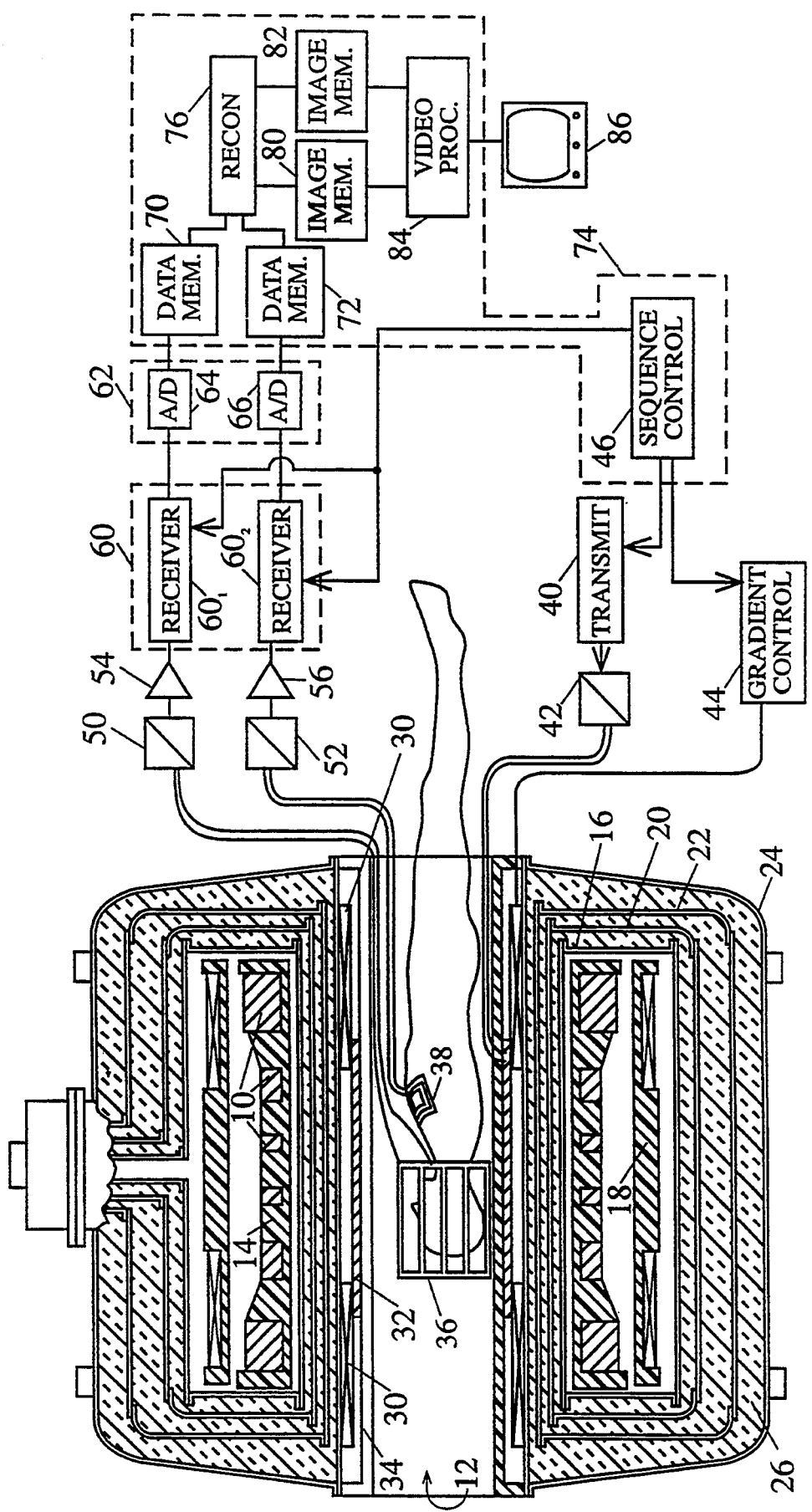
FIG. 1 is a diagrammatic illustration of magnetic resonance imaging apparatus in accordance with the present invention in which multiple human organs are imaged simultaneously with a single transmitter and multiple independent RF receiver coil assemblies.

With reference to FIG. 1, a plurality of superconducting main magnetic field coils 10 generate a generally uniform static magnetic field along a longitudinal or z-axis of a central bore 12. The superconducting coils are mounted on a dielectric former 14 and received in an annular, helium vessel 16. The helium vessel is filled with liquid helium to maintain the superconducting magnets at their superconducting temperature. A main magnetic field shield coil assembly 18 generates a magnetic field which opposes the fields generated by the main magnets 10 in regions surrounding the superconducting magnets 10.

The annular helium reservoir 16 is surrounded by a first cold shield 20 which is maintained at about 20° K. or less. A second cold shield assembly 22 is chilled to about 60°–70° K. or less. An outer vacuum vessel 24 encases the cold shields to define a vacuum reservoir therearound. Layers of mylar insulation 26 are arranged between the vacuum vessel 24 and the cold shield 22.

A circularly cylindrical, whole body gradient coil assembly 30 is mounted on a circularly cylindrical dielectric former and mounted within the bore 12. A circularly cylindrical, whole body RF coil 32 is mounted on a circularly cylindrical dielectric former and mounted within the bore 12. A circularly cylindrical dielectric cosmetic sleeve 34 shields the RF and gradient coils from view and protects them from damage.

Two or more receive coils are disposed in the bore 12 in close proximity to the patient. In the illustrated embodiment, a quadrature birdcage type head coil 36 and a quadrature flat surface coil 38, e.g. a Helmholtz and loop coil. Of course, other quadrature or linear coils may be provided as are known in the art.

A transmitter 40 is connected with the whole body RF coil 32 for transmitting resonance excitation and manipulation pulses thereto. Preferably, a quadrature divider 42 splits the radio frequency signal into two components and phase shifts one component 90° relative to the other. The two components are applied in quadrature to the whole body RF coil. A gradient control means 44 is connected with the gradient magnetic field coils 30 for providing current pulses thereto for generating magnetic gradient pulses across the examination region. A sequence control means controls the radio frequency transmitter 40 and the gradient control means 44 to generate conventional resonance excitation sequences such as spin echo, gradient echo, field echo, sequences and the like. Preferably, resonance is excited in two preselected planes or slabs by applying a linear z-gradient field concurrently with a tailored radio frequency excitation pulse for exciting resonance in the two or more preselected slices or slabs. Preferably, one of the slices or slabs intersects the region examined by each of the surface coils 36 and 38. U.S. Pat. No. 4,034,191 explains the selection process for selecting the frequency bands to which resonance is to be limited.

The radio frequency transmitter 40 and the gradient control 44 under the control of the sequence control 46 elicit simultaneous magnetic resonance responses in planes or slabs through each of the quadrature surface coils 36 and 38. The signals from the two quadrature surface coils are conveyed to a pair of quadrature combiners 50, 52. The quadrature combiners impose a 90° phase shift on one of the detected quadrature components and combine the components. Preamplifiers 54, 56 amplify the signals before they are received by a receiver means 60, such as a pair of digital quadrature receivers $60_1$, $60_2$, which receive and demodulate the resonance signals. An interface circuit 62 includes analog-to-digital converters 64, 66 for digitizing each received resonance signal to generate a digital data line.

The digital data lines are stored in data memories 70, 72 of a computer means 74. An image reconstruction means such as an inverse two-dimensional Fourier transform means 76 reconstructs sets of data lines from the data memories 70, 72 into electronic digital image representations which are stored in image memories 80, 82. A video processor means 84 converts the digital image representations into the appropriate video format for display on a video monitor 86 or other human-readable display.

Figure 2:
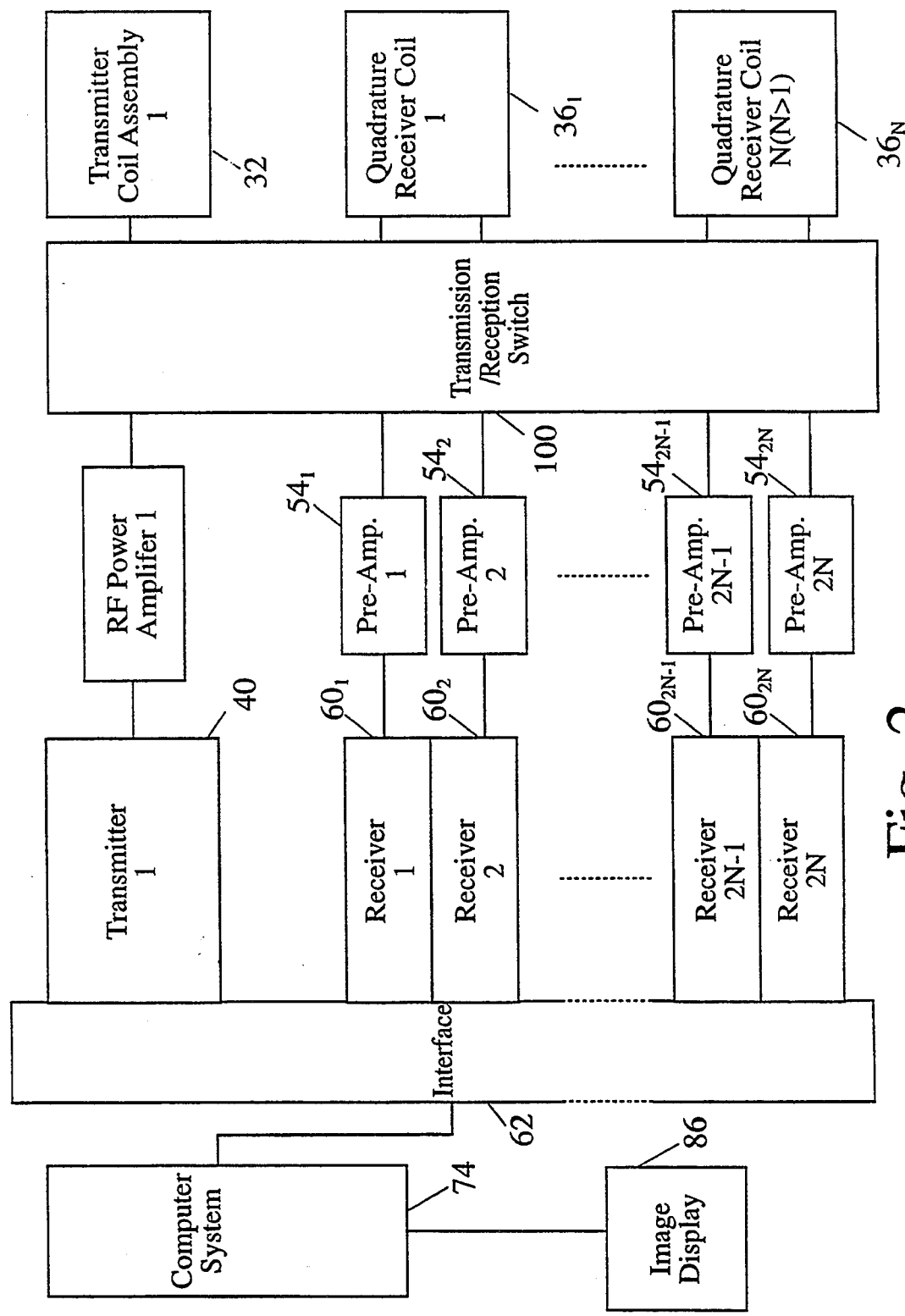
FIG. 2 is a diagrammatic illustration of an alternate embodiment of the present invention for simultaneously imaging multiple human organs with a single transmitter and multiple independent RF coil assemblies and multiple receivers.

In the embodiment of FIG. 2, N quadrature surface receiver coils are provided, where N is a plural integer. In the embodiment of FIG. 2, the transmitter 40 applies the appropriate RF pulses to a common transmitter coil assembly 32 concurrently with the application of conventional gradient magnetic field pulses. A transmission reception switch means 100 blocks the quadrature receiver coils from providing output signals during transmission. During reception, the two quadrature components from each quadrature receiver coil are processed separately, rather than being combined by a quadrature combiner. The output signals from the quadrature receiver coils $36_1, \ldots, 36_N$ are conveyed to preamplifiers $54_1, 54_2, \ldots, 54_{2N-1}, 54_{2N}$. The two quadrature component signals are conveyed to digital receivers $60_1, 60_2, \ldots, 60_{2N-1}, 60_{2N}$. The signals from the 2N digital receivers are digitized by the interface means 62 and stored in each of 2N data memory means. The individual components are reconstructed into 2N image representations. The video processing means selectively displays individual ones or combinations of the 2N image representations generated through N slices of the patient. Typically, a plurality of slices will be generated through each of the N quadrature coils at regular intervals to generate a volume of data through each coil. The video processor means 84 selectively generates images through selected planes or surfaces of each of the volumes of data.

Figure 3:
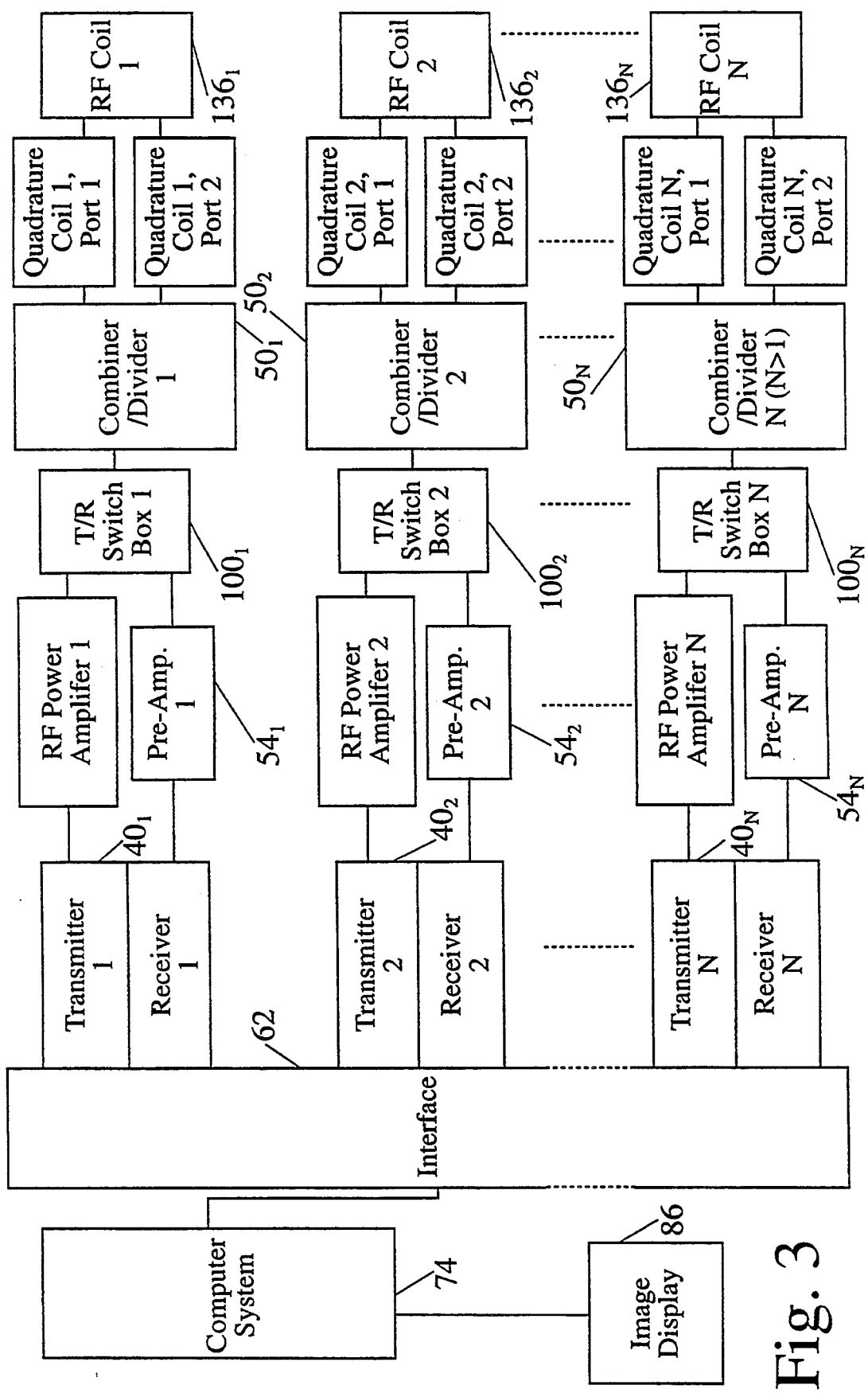
FIG. 3 is another alternate embodiment of the present invention for simultaneously imaging multiple human organs with multiple independent RF quadrature coils, multiple transmitters, and multiple receivers.

With reference to FIG. 3, each of the quadrature coils is used in both a transmit and a receive mode. N digital transmitters $40_1, 40_2, \ldots, 40_N$ are each connected by power amplifiers with a transmit/receive switch box $100_1, 100_2, \ldots, 100_N$. In a transmit mode, quadrature combiner/dividers $50_1, 50_2, \ldots, 50_N$ divide the RF component into two equal components and phase shift one of the components 90°. The 90° phase shifted components are connected to each of the two ports of quadrature surface coils $36_1, 36_2, \ldots, 36_N$.

In the receive mode, the quadrature combiner/divider circuits $50_1, 50_2, \ldots, 50_N$ shift the phase of one of the components received from the corresponding surface coil by 90° and combine or superimpose the two components. The transmit switches $100_1, 100_2, \ldots, 100_N$ are switched to a receive mode which connects the combined signals to preamplifiers $54_1, 54_2, \ldots, 54_N$. The resonance signals are conveyed to each of N digital receivers $60_1, 60_2, \ldots, 60_N$. The interface 62 digitizes the resonance signals which are received and demodulated by the N receivers and causes the data lines to be stored in appropriate data memories of the computer means 74 for reconstruction into appropriate image representations. It is to be appreciated, that a quadrature combiner/divider need not be used with all of the coils. Rather, analogous to the embodiment of FIG. 2, each port of some or all of the quadrature coils can be connected to separate digital transmitters and with separate digital receivers. Analogously, the common transmit coil 32 may be used in conjunction with some but not all of the gradient surface coils. The tailored excitation of the RF signals applied to the whole body RF coil 32 may limit excitation to slices through only some of the surface coils. The other surface coils can be used in both a transmit and a receive mode.

Figure 4:
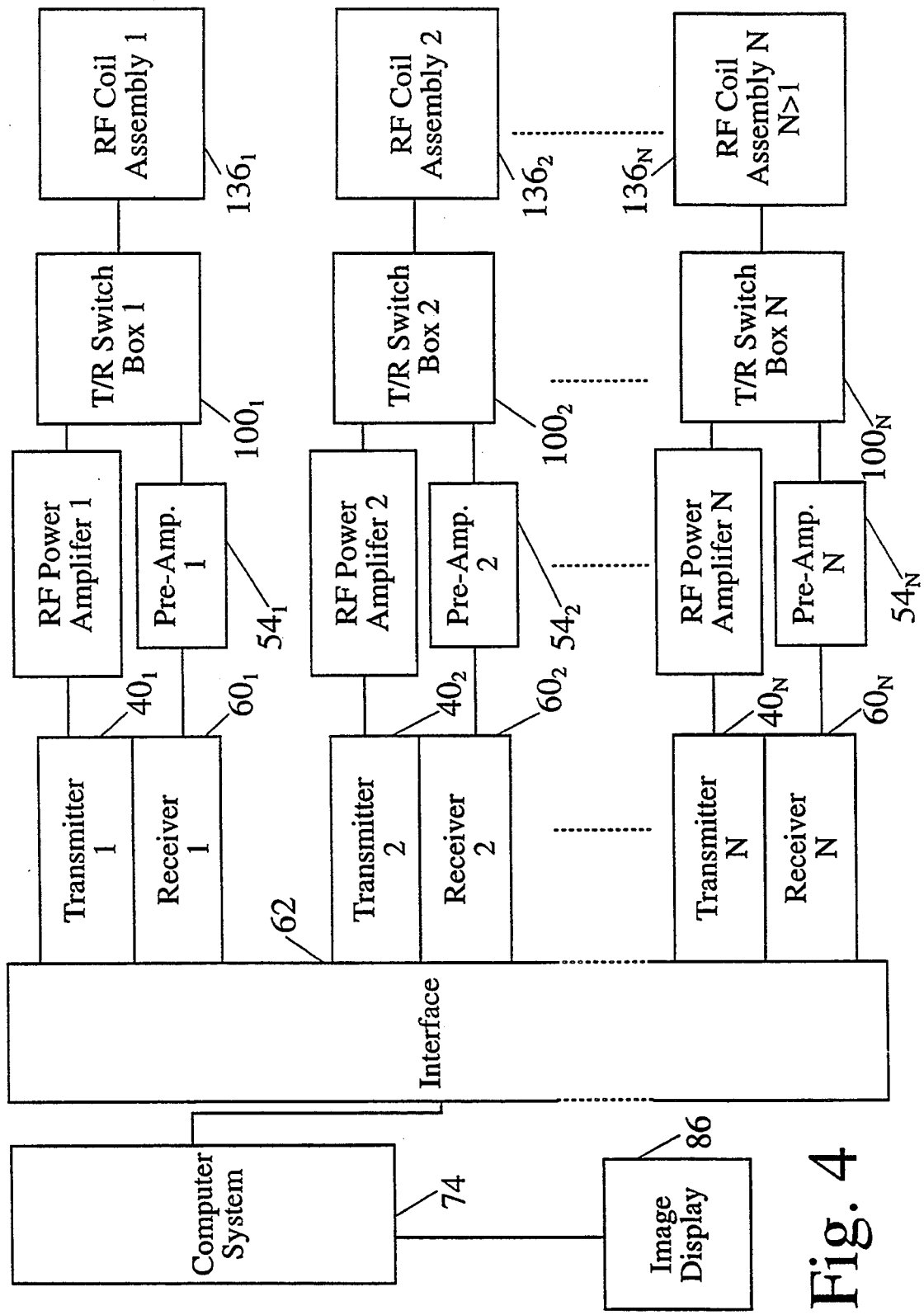
FIG. 4 is a diagrammatic illustration of a system for simultaneously imaging multiple human organs with multiple independent RF coil assemblies and multiple RF transmitter/receiver assemblies.

With reference to FIG. 4, the present invention is also applicable to use with linear, non-quadrature coils. N individual transmitters $40_1, 40_2, \ldots, 40_N$ which are controlled by the common sequence control means 46 concurrently transmit RF pulses to transmit receive switch means $100_1, 100_2, \ldots, 100_N$. In the transmit mode, the transmit/receive switch means convey the RF signal to linear RF coils $136_1, 136_2, \ldots, 136_N$. In the receive mode, the transmit/receive switch means convey the received signals to preamplifiers $54_1, 54_2, \ldots, 54_N$ and corresponding receivers $60_1, 60_2, \ldots, 60_N$. The interface means 62 digitizes the received resonance signals and conveys them to data memory means in the computer means 74.

It is to be appreciated that a mixture of linear coils as illustrated in FIG. 4 and quadrature coils as illustrated in FIGS. 1, 2, or 3 may be intermixed. For example, a quadrature head coil might be used in conjunction with a linear cardiac coil. Although the transmitter means in FIGS. 3 and 4 function relatively independently, there is a single gradient coil control 44 which controls whole body gradient coils 30. Because common gradient magnetic field pulses are applied, the operation of the multiple transmitters must be coordinated. Although the transmitters are operated in a coordinated manner, all need not operate identically. For example, some of the transmitters may omit alternate cycles to provide a longer duration between repetitions for its local spin system to relax towards equilibrium.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging system which simultaneously images at least first and second displaced organs of a subject, the system comprising:
   a main magnet means for generating a static magnetic field through an examination region in which a portion of the subject including the first and second organs is disposed;
   a gradient field means for selectively generating magnetic field gradients across the examination region as a whole;
   a magnetic resonance excitation means for exciting magnetic resonance in at least first and second organs of the subject portion in the examination region;

a magnetic resonance imaging sequence control means connected with the resonance excitation means and the gradient field means for causing the resonance excitation means and the gradient means to apply RF and gradient field pulses of magnetic resonance imaging sequences to the examination region;

a first radio frequency coil disposed adjacent the first organ for receiving magnetic resonance signals from the first organ;

a second radio frequency coil displaced from the first radio frequency coil and disposed adjacent the second organ for receiving magnetic resonance signals from the second organ;

a first radio frequency receiver means connected with the first radio frequency coil for receiving and demodulating magnetic resonance signals received by the first radio frequency coil;

a second radio frequency receiver means for receiving and demodulating magnetic resonance signals received by the second radio frequency coil;

a reconstruction means for reconstructing magnetic resonance signals received and demodulated by the first radio frequency receiver means into first electronic image representations of the first organ and for reconstructing magnetic resonance signals received and demodulated by the second radio frequency receiver means into second electronic image representations of the second organ;

a video processing means for selectively converting the first and second electronic image representations into a human-readable display.

2. The system as set forth in claim 1 wherein the first radio frequency coil is a quadrature coil and further including a quadrature combiner connected between the first radio frequency coil and the first radio frequency receiver means, the first combiner means imposing a 90° relative phase shift on one of two components received from the first radio frequency coil and combining the two components together.

3. The system as set forth in claim 2 wherein the first radio frequency coil includes a birdcage coil.

4. The system as set forth in claim 2 wherein the second radio frequency coil is a quadrature coil and further including a quadrature combiner connected between the second radio frequency coil and the second radio frequency receiver means, the second combiner means imposing a 90° relative phase shift on one of two components received from the second radio frequency coil and combining the two components together.

5. The magnetic resonance imaging system which simultaneously images at least separate first and second regions of a subject, the system comprising:

a main magnet means for generating a static magnetic field through the separate first and second regions of a subject;

a gradient field means for selectively generating magnetic field gradients across the separate first and second regions;

a whole body RF coil disposed around the examination region;

a radio frequency transmitter for transmitting radio magnetic pulses to the whole body RF coil for exciting magnetic resonance in the separate first and second regions;

a magnetic resonance imaging sequence control means connected with the radio frequency transmitter and the gradient field means for causing the gradient means to apply RF and gradient field pulses of magnetic resonance imaging sequences to the separate first and second regions;

first and second non-overlapping radio magnetic coils disposed adjacent the first and second regions, respectively, for receiving magnetic resonance signals from the first and second regions, respectively, the first and second radio magnetic coils being physically separated from each other;

a first radio frequency receiver means connected with the first radio frequency coil for receiving and demodulating magnetic resonance signals received by the first radio frequency coil;

a second radio frequency receiver means for receiving and demodulating magnetic resonance signals received by the second radio frequency coil;

a reconstruction means for reconstructing magnetic resonance signals received and demodulated by the first radio frequency receiver means into first electronic image representations and for reconstructing magnetic resonance signals received and demodulated by the second radio frequency receiver means into second electronic image representations;

a video processing means for selectively converting the first and second electronic image representations into a human-readable display.

6. The system as set forth in claim 5 wherein the whole body RF coil is a quadrature coil and further including a quadrature divider connected between the transmitter and the whole body RF coil for dividing the radio frequency pulses into two components and shifting one of the components 90° relative to the other.

7. The system as set forth in claim 6 wherein the first radio frequency coil is a quadrature coil and further including a first quadrature combiner means connected between the first radio frequency coil and the first radio frequency receiver means, the first quadrature combiner means imposing a 90° relative phase shift on one of two components received from the first radio frequency coil and combining the two components together.

8. The system as set forth in claim 7 wherein the second radio frequency coil is a quadrature coil and further including a second quadrature combiner means connected between the second radio frequency coil and the second radio frequency receiver means, the second quadrature combiner means imposing a 90° relative phase shift to one of two components received from the second radio frequency coil and combining the two components together.

9. The system as set forth in claim 6 wherein at least the first radio frequency coil is a quadrature coil and wherein the first radio frequency receiver means includes a first digital receiver connected with a first port of the first radio frequency coil for receiving one quadrature component therefrom and a second digital receiver connected with a second port of the first radio frequency coil for receiving a second quadrature component therefrom.

10. A magnetic resonance imaging system which simultaneously images at least two regions of a subject, the system comprising:

a main magnetic means for generating a static magnetic field through a portion of a subject in an examination region;

a gradient field means for selectively generating magnetic field gradients across the examination region as a whole;

a magnetic resonance excitation means for exciting magnetic resonance in at least first and second subregions of the subject portion in the examination region;

a magnetic resonance imaging sequence control means connected with the resonance excitation means and the gradient field means for causing the resonance excitation means and the gradient means to apply RF and gradient field pulses of magnetic resonance imaging sequences to the examination region;

a first radio frequency quadrature coil having first and second output ports the first radio frequency quadrature coil being disposed adjacent the first subregion for receiving magnetic resonance signals from the first subregion;

a second radio frequency quadrature coil having first and second output ports disposed adjacent the second subregion for receiving magnetic resonance signals from the second subregion;

a first digital receiver connected with the first radio frequency quadrature coil first port for receiving and demodulating one quadrature component therefrom;

a second digital receiver connected with the first radio frequency quadrature coil second port for receiving and demodulating a second quadrature component therefrom;

a third digital receiver connected with the second radio frequency quadrature coil first port for receiving and demodulating a quadrature component therefrom;

a fourth digital receiver connected with the second radio frequency quadrature coil second port for receiving and demodulating a quadrature component therefrom;

a reconstruction means for reconstructing magnetic resonance signals received and demodulated by the first, second, third, and fourth digital receivers into at least first and electronic image representations;

a video processing means for selectively converting the first and second electronic image representations into a human-readable display.

11. A magnetic resonance imaging system which simultaneously images at least first and second separated regions of a subject, the system comprising:

a main magnet means for generating a static magnetic field through the first and second separated regions of a subject;

a gradient field means for selectively generating magnetic field gradients across the first and second regions;

a first radio frequency coil disposed adjacent the first region for transmitting radio frequency excitation signals into and receiving radio frequency magnetic resonance signals from the first region;

a second radio frequency coil disposed adjacent the second region for transmitting radio frequency excitation signals into and receiving radio frequency magnetic resonance signals from the second region;

a first radio frequency transmitter means connected with the first radio frequency coils;

a second radio frequency transmitter means connected with the second radio frequency coil, such that the first and second radio frequency coils operate in both transmit and reception modes;

a magnetic resonance imaging sequence control means connected with the first and second radio frequency transmitter means and the gradient field means for causing the first and second radio frequency transmitter means and the gradient means to apply RF and gradient field pulses of magnetic resonance imaging sequences to the first and second separated regions;

a first radio frequency receiver means connected with the first radio frequency coil for receiving and demodulating magnetic resonance signals received by the first radio frequency coil;

a second radio frequency receiver means for receiving and demodulating magnetic resonance signals received by the second radio frequency coil;

a reconstruction means for reconstructing magnetic resonance signals received and demodulated by the first radio frequency receiver means into first electronic image representations and for reconstructing magnetic resonance signals received and demodulated by the second radio frequency receiver means into second electronic image representations;

a video processing means for selectively converting the first and second electronic image representations into a human-readable display.

12. The system as set forth in claim 11 wherein the first radio frequency coil includes a quadrature coil and further including a first combiner/divider means connected between the first radio frequency coil and the first radio frequency transmitter means and the first radio frequency receiver means, the first combiner/divider means in a transmit mode divides an RF signal received from the first radio frequency transmitter means into two transmit mode components and shifts the relative phase of one of the transmit mode components by 90° relative to the other, the two transmit mode components being conveyed to the first radio frequency coil and, in a receiving mode, the first combiner/divider means imposes a 90° phase shift on one received resonance signal component received from the first receiver coil relative to a second received resonance signal component and combines the two received resonance signal components, the combined resonance signal components being conveyed to the first receiver means.

13. The system as set forth in claim 12 wherein the second radio frequency coil includes a quadrature coil and further including a second combiner/divider means connected between the second radio frequency coil and the second radio frequency transmitter means and the second radio frequency receiver means, the second combiner/divider means in a transmit mode divides an RF signal received from the second radio frequency transmitter means into two transmit mode components and shifts the relative phase of one of the transmit mode components by 90°, the two transmit mode components being conveyed to the second receiver coil and, in a receiving mode, the second combiner/divider means imposes a 90° phase shift on one received resonance signal component received from the second radio frequency coil relative to a second received resonance signal component and combines the two received resonance signal components, the combined resonance signal components being conveyed to the second radio frequency receiver means.

14. The system as set forth in claim 13 wherein the first and second transmitter means include digital transmitters and the first and second receiver means include digital receivers.

15. The system as set forth in claim 12 wherein the first coil includes a birdcage coil.

16. The system as set forth in claim 11 wherein at least the first radio frequency coil includes a quadrature coil having first and second ports and wherein the first radio frequency receiver means includes a first digital receiver connected with the first port for receiving one quadrature component therefrom and a second digital receiver connected with the second port for receiving a second quadrature component therefrom.

17. A magnetic resonance imaging apparatus comprising:
- a static magnetic field means for creating a common static magnetic field through an examination region in which at least first and second displaced portions of a subject are disposed;
- a magnetic field gradient means for applying magnetic field gradients across the examination region as a whole;
- a magnetic resonance means for exciting and manipulating magnetic resonance concurrently in at least the first and second displaced portions of the subject;
- at least first and second displaced, non-overlapping RF coils disposed adjacent the first and second displaced portions, respectively, for concurrently receiving magnetic resonance signals from the first and second displaced portions, respectively, at least one of the first and second RF coils being a quadrature coil;
- a processing means for processing the magnetic resonance signals received by the first and second RF coils into first and second image representations, respectively.

18. A method of magnetic resonance imaging comprising:
- creating a static magnetic field through an examination region in which at least a portion of a subject is disposed;
- applying magnetic field gradients across the examination region as a whole while exciting and manipulating magnetic resonance concurrently in at least first and second selected displaced subregions of the subject;
- concurrently receiving magnetic resonance signals from the first and second displaced subregions with non-overlapping first and second RF coils disposed adjacent the first and second displaced subregions, respectively;
- concurrently demodulating the resonance signals received by the first and second RF coils with first and second receivers, respectively;
- processing the demodulated magnetic resonance signals from the first and second receivers into first and second image representations, respectively.

19. The method as set forth in claim 18 wherein the step of exciting and manipulating magnetic resonance includes applying radio frequency signals to the first and second RF coils, such that the first and second RF coils work in both transmit and receive modes.

20. The method as set forth in claim 18 wherein the step of exciting and manipulating magnetic resonance includes applying RF signals to a common RF coil which radiates RF signals into both the first and second regions.

21. The method as set forth in claim 18 wherein the excitation and reception of magnetic resonance signals in at least the first subregion is in quadrature.

* * * * *